United States Patent [19]

Bruni

[11] 3,997,221
[45] Dec. 14, 1976

[54] ELECTRONIC EQUIPMENT CABINET

[75] Inventor: James G. Bruni, Manhattan Beach, Calif.

[73] Assignee: Baxter Laboratories, Inc., Deerfield, Ill.

[22] Filed: Mar. 18, 1976

[21] Appl. No.: 668,019

[52] U.S. Cl. .............................. 312/294; 312/243; 312/302

[51] Int. Cl.$^2$ ...................................... A47B 88/00

[58] Field of Search .......... 312/273, 243, 294, 298, 312/302, 250, 320

[56] References Cited

UNITED STATES PATENTS

| 506,351 | 10/1893 | Wasson | 312/243 |
|---|---|---|---|
| 924,395 | 6/1909 | Spoljar | 312/243 |
| 1,987,822 | 1/1935 | Gregory | 312/243 |
| 2,541,352 | 2/1951 | Ginter | 312/294 |
| 2,994,807 | 8/1961 | Devine et al. | 312/302 |
| 3,131,010 | 4/1964 | Erath | 312/243 |
| 3,220,790 | 11/1965 | White | 312/298 |
| 3,564,202 | 2/1971 | Oppenheim | 312/302 |

Primary Examiner—Paul R. Gilliam
Assistant Examiner—Victor N. Sakran
Attorney, Agent, or Firm—Eugene M. Cummings; Richard G. Kinney

[57] ABSTRACT

A housing for electronic equipment includes a bottom cabinet and an upper compartment mounted thereon with the cover of the compartment including a front panel having operating buttons and/or other control features located thereon. The rear walls of the upper compartment and bottom cabinet form a common member for both sections of the apparatus. The upper compartment has a cover which includes the front panel and which cover is hinged at its upper rear corner to the upper edge of the common rear panel or closure member so as to be upwardly and rearwardly tiltable to expose the interior of the upper compartment. The common rear wall or closure member is also pivoted adjacent its bottom end on the lower cabinet so as to be rearwardly and downwardly tiltable to expose from the rear the interiors of the upper compartment and lower cabinet.

4 Claims, 5 Drawing Figures

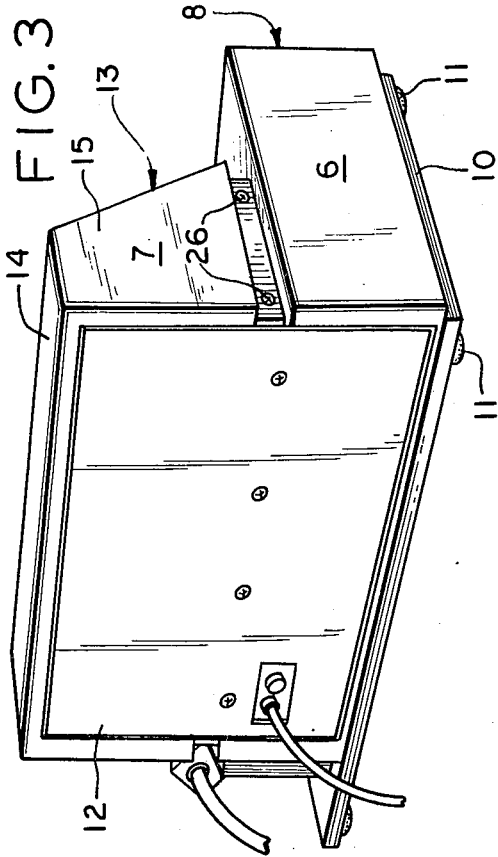
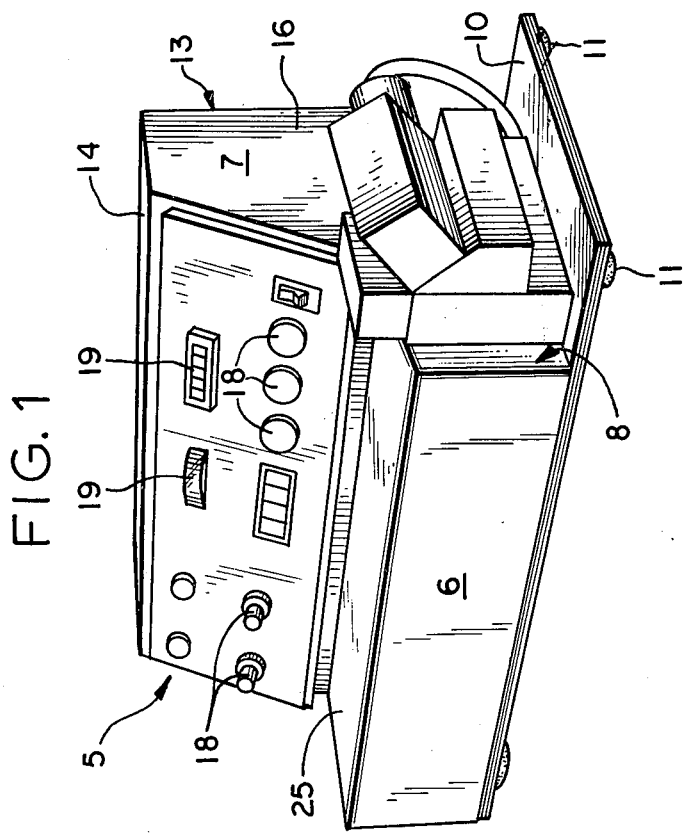
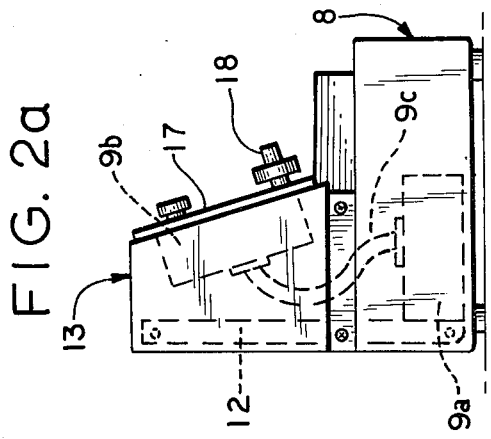
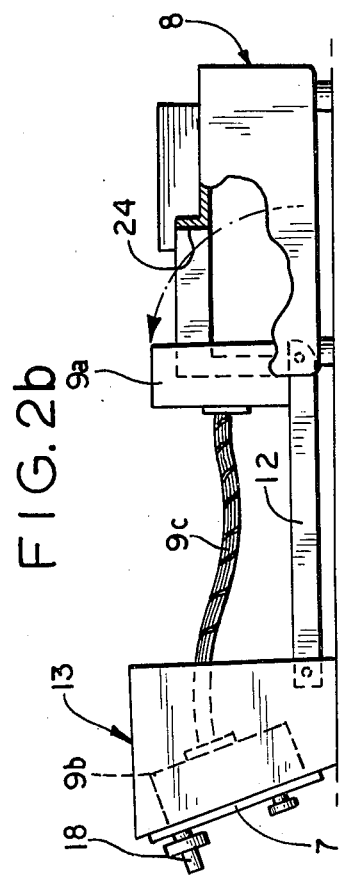

3,997,221

ELECTRONIC EQUIPMENT CABINET

BACKGROUND OF THE INVENTION

The present invention is directed generally to equipment cabinets, and more particularly to an equipment cabinet having upper and lower portions for containing electronic apparatus.

Various types of scientific or electronic apparatus, such as laser-nephelometers, may have a large main lower cabinet housing various components, and an upper compartment mounted on the lower cabinet for containing other components of the apparatus; such as indicators and operator-accessible controls. A control panel may be provided on the front of the upper compartment which includes a plurality of apertures or openings therein to accomodate a plurality of spindles or control shafts on which control knobs may be mounted, as well as various push buttons, signal lights, meters and other indicating elements necessary for operation of the apparatus.

It becomes necessary from time to time to gain access to the interior of the upper compartment and lower cabinet of such apparatus to inspect, adjust, clean, or replace components of the apparatus. Accordingly, it is desirable to provide for convenient and easy access to the upper compartment and lower cabinet of such apparatus to minimize the amount of time required for servicing or otherwise performing inspections or other operations wherein access to the interiors of the upper compartments and/or lower cabinets is required.

The present invention provides a novel and convenient arrangement for providing such convenient access to the interiors of the compartment and/or cabinet.

SUMMARY OF THE INVENTION

The invention is directed to scientific apparatus of the type having a lower cabinet with an upper compartment mounted thereon. A common rear wall member encloses the rear sides of both the lower cabinet and the upper compartment. The upper comparment also includes a front panel on which various control elements are mounted and this front panel forms one wall of a cover member which is hinged at the upper rear corner thereof to the upper end of the common rear wall member. The rear wall member will usually be vertical, rectangular and planar. It is hinged adjacent its lower end or lower edge onto the lower or bottom cabinet. With this arrangement the cover of the upper compartment may be rotated or tilted upwardly and rearwardly so as to expose the interior of the upper compartment. After the cover of the upper compartment has been upwardly and rearwardly tilted the common back closure or wall member may also be tilted rearwardly so as to expose from the rear the interiors of both the upper compartment and the lower cabinet.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a front perspective view of a laser-nephelometer apparatus in which one form of the invention is embodied.

FIG. 2a is a side elevational view of the apparatus shown in FIG. 1.

FIG. 2b is a side elevational view similar to FIG. 2a with the common rear wall of the apparatus rearwardly and downwardly tilted so as to expose the interiors of the upper and lower compartments.

FIG. 3 is a rear perspective view of the apparatus shown in FIG. 1.

DECRIPTION OF THE PREFERRED EMBODIMENT

Figure 4:
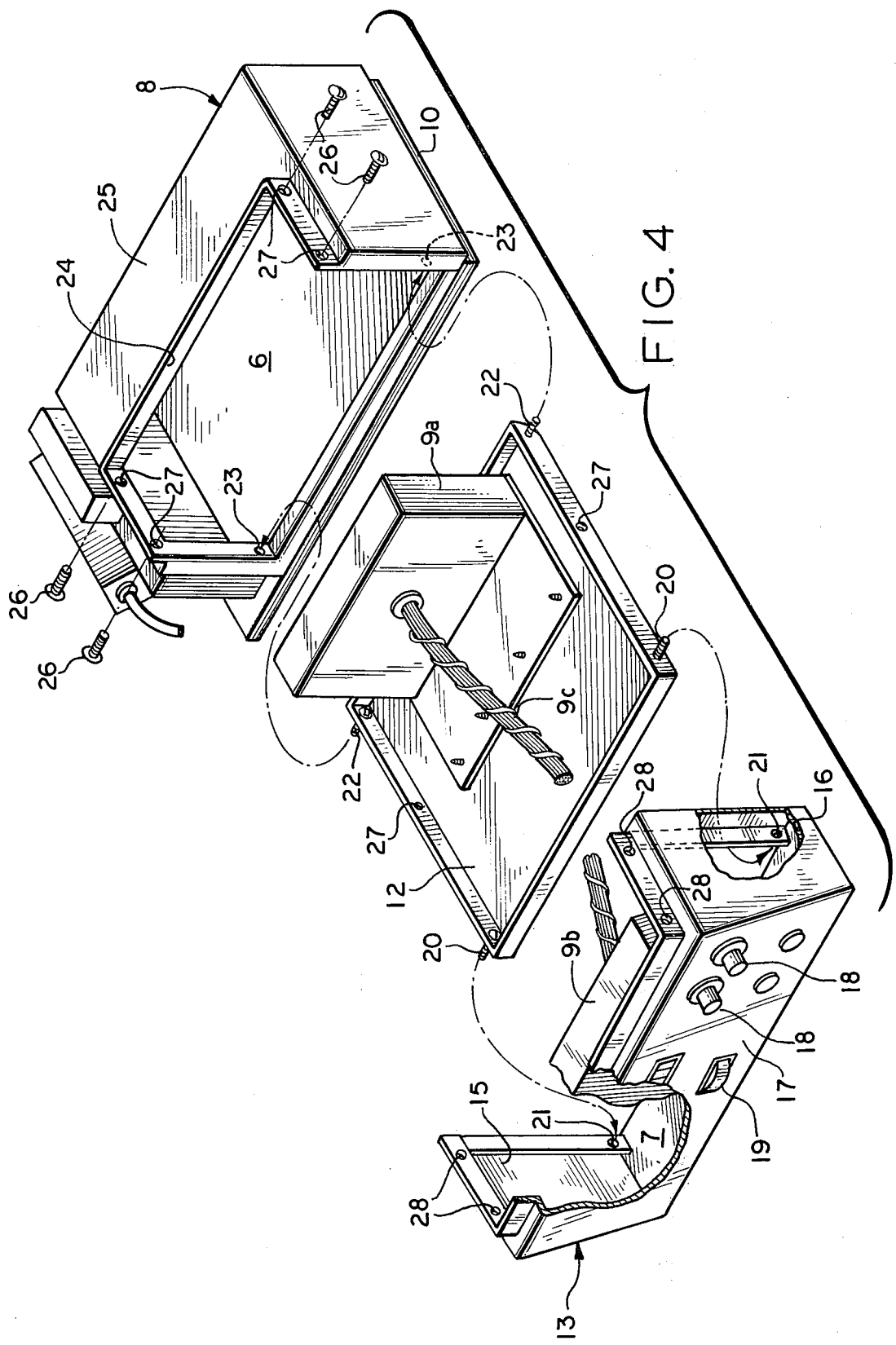
FIG. 4 is an exploded view showing the common rear wall together with the cabinet and upper compartments of the apparatus.

Referring to the Figures, the invention is incorporated in a scientific apparatus in the form of a laser-nephelometer 5 having a lower compartment 6 and an upper compartment 7. This type of apparatus is used to discretely quantitate immunoglobulin and specific protein levels in human body fluids by measuring the formation of antigen/antibody complexes in precipitin reactions, and typically employs a collimated beam laser device as the nephelometric light source.

The various components of the apparatus 5 are housed within the lower or bottom compartment 6 and the upper or top compartment 7. The present invention is not concerned with the details of the various components of the apparatus or the manner in which these components function or operate, but rather with the construction of the apparatus housing whereby convenient access may be gained to the interiors of the bottom and upper compartments.

The bottom compartment 6 includes a generally elongated rectangular box-like housing section 8 within which a first portion 9a of the components of the apparatus are mounted on a flat base member 10 provided with corner feet 11. The rear wall 12 of the bottom compartment 6 is rectangular and planar and has a height such that it not only provides the rear wall for the bottom compartment 6 but also provides the rear wall of the upper compartment 7. The upper compartment 7, which contains a second portion 9b of the components of the apparatus connected to the first portion by a cable 9c, includes an upwardly and rearwardly tiltable housing section 13 formed by a horizontal upper panel 14, two end panels 15 and 16, and an upwardly and rearwardly inclined front panel 17. It will be understood that the upper horizontal member 14 and the two end panels 15 and 16 may be integrally formed from a single piece of material if desired.

As will be apparent from FIGS. 1 and 4, the upwardly and rearwardly inclined front panel 17 of housing section 13 is provided with a number of apertures for accomodating various control features associated with the components 9b contained in the upper compartment, including a plurality of knobs 18 and indicators 19. It will be understood that the particular number, grouping and formation in the various openings in the panel 17 do not constitute a feature of the present invention and may take different forms, groupings and numbers other than that shown.

Housing section 13 is hinged at its upper rear corner to the upper end or edge of the vertical wall member 12 by means of a pair of hinge pins 20, which may be concealed behind the respective side panels if desired.

The housing section 13 may include a pair of apertures 21 (FIG. 4) for receiving these pins. The common rear wall 12 for the lower and upper compartments is also hinged adjacent its bottom end to the housing section 8 by means of a pair of hinge pins 22 which extend through apertures 23 in the lower rear corners of the end walls of the bottom housing section 8. Like pins 20, hinge pins 22 may be concealed behind decorative side panels.

By reason of this double-hinge arrangement it will be seen that housing section 13 can be upwardly and rearwardly rotated as shown in FIG. 2b the components 9a pivoting through an opening 24 in the top surface 25 of housing section 8 to the vertical position shown in FIG. 2b. This simultaneously exposes both the first and second portions 9a and 9b of the apparatus, thus greatly simplifying servicing and/or cleaning of the apparatus. When not opened for servicing, housing sections 8 and 13 may be joined together to form a unitary housing for apparatus 5 by means of machine screws 26, which extend through apertures 27 in housing section 8 and panel 12 and into threaded engagement with apertures 28 in housing section 13.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:
1. In a scientific apparatus comprising a lower compartment containing apparatus components and having mounted thereon an upper compartment containing additional apparatus components, said upper compartment having a cover including a front panel on which various control elements are mounted, the improvement comprising, a common back member for said lower comparment and upper compartment, the lower portion of said back member forming the back cover of said lower compartment, the upper portion of said back member forming the back cover of said upper compartment, said cover being hinged on the upper end of said back member and upwardly and rearwardly swingable on the upper end of said back member whereby the interior of said upper compartment is exposed, and said back member being hinged adjacent its bottom end on said lower compartment and rearwardly tiltable to expose the interiors of said lower and upper compartments.

2. A scientific apparatus as defined in claim 1 wherein said front panel of said cover is upwardly and rearwardly inclined.

3. A scientific apparatus as defined in claim 1 wherein said apparatus is a nephelometer apparatus.

4. A scientific apparatus as defined in claim 1 wherein said common back member is generally vertical, rectangular and planar.

* * * * *